US007319197B2

(12) United States Patent
Oggioni et al.

(10) Patent No.: US 7,319,197 B2
(45) Date of Patent: Jan. 15, 2008

(54) STRUCTURE OF STACKED VIAS IN MULTIPLE LAYER ELECTRODE DEVICE CARRIERS

(75) Inventors: Stefano Oggioni, Milan (IT); Michele Castriotta, Manfredonia (IT); Gianluca Rogiani, Milan (IT); Mauro Spreafico, Sesto San Giovanni (IT); Giorgio Viero, Stezzano (IT)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 10/515,511

(22) PCT Filed: Apr. 18, 2003

(86) PCT No.: PCT/EP03/12647

§ 371 (c)(1),
(2), (4) Date: Nov. 19, 2004

(87) PCT Pub. No.: WO2004/017687

PCT Pub. Date: Feb. 26, 2004

(65) Prior Publication Data

US 2005/0156319 A1   Jul. 21, 2005

(30) Foreign Application Priority Data

May 23, 2002 (EP) .................................. 02368053

(51) Int. Cl.
*H01R 12/04* (2006.01)
*H05K 1/11* (2006.01)
(52) U.S. Cl. ....................... 174/262; 361/792; 361/803
(58) Field of Classification Search ........ 174/262–266; 361/792–795, 803
See application file for complete search history.

(56) References Cited

U.S. PATENT DOCUMENTS

| 5,219,639 | A | * | 6/1993 | Sugawara et al. | .......... 428/209 |
| 5,320,894 | A | | 6/1994 | Hasegawa | |
| 6,329,610 | B1 | * | 12/2001 | Takubo et al. | .............. 174/264 |
| 6,407,343 | B1 | * | 6/2002 | Tanaka | ........................ 174/261 |
| 7,091,424 | B2 | * | 8/2006 | Oggioni et al. | .............. 174/262 |
| 2006/0202344 | A1 | * | 9/2006 | Takada et al. | .............. 257/758 |

FOREIGN PATENT DOCUMENTS

| JP | 03-048495 | 3/1991 |
| JP | 03-142896 | 6/1991 |
| JP | 04-023495 | 1/1992 |
| JP | 06-326471 | 11/1994 |
| JP | 08-008393 | 1/1996 |
| JP | 2001-036247 | 2/2001 |

* cited by examiner

*Primary Examiner*—Tuan T. Dinh
*Assistant Examiner*—Jeremy C Norris
(74) *Attorney, Agent, or Firm*—Wenjie Li

(57) ABSTRACT

A stacked via structure (200) adapted to transmit high frequency signals or high intensity current through conductive layers of an electronic device carrier is disclosed. The stacked via structure comprises at least three conductive tracks (205a, 205b, 205c) belonging to three adjacent conductive layers (110a, 110b, 110c) separated by dielectric layers (120), aligned according to z axis. Connections between these conductive tracks are done with at least two vias (210, 215) between each conductive layer. Vias connected to one side of a conductive track are disposed such that they are not aligned with the ones connected to the other side according to z axis.

10 Claims, 6 Drawing Sheets

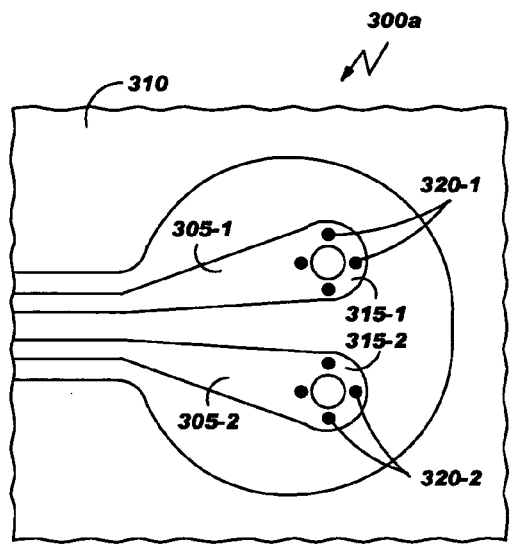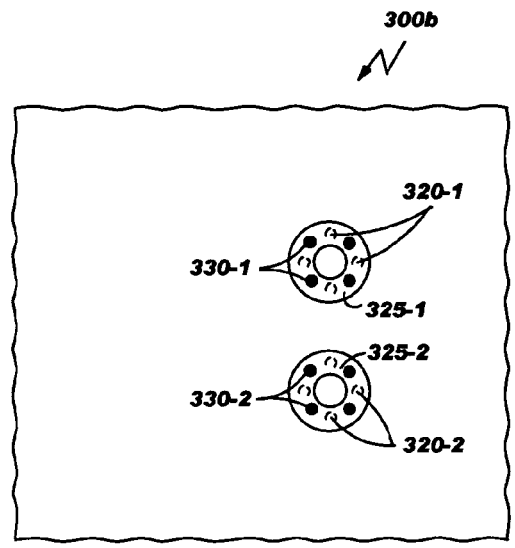
Figure 3a　　　　　　　　　　Figure 3b
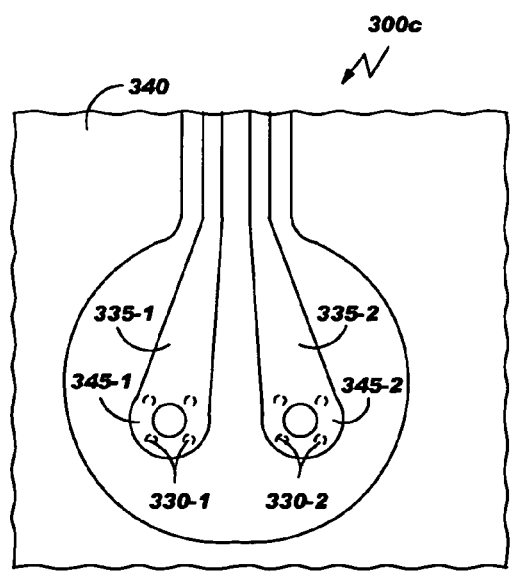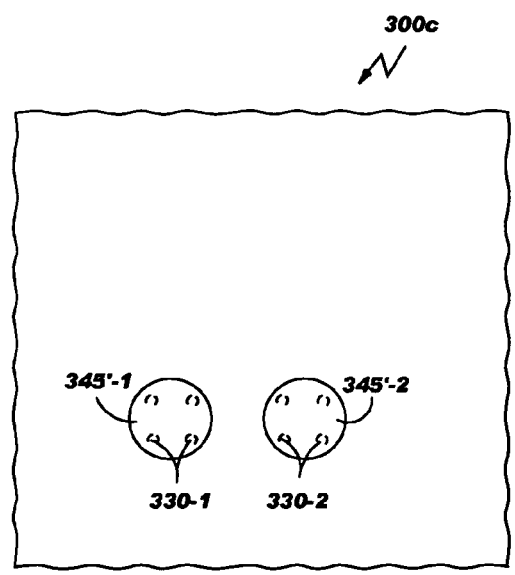
Figure 3c　　　　　　　　　　Figure 3c'

STRUCTURE OF STACKED VIAS IN MULTIPLE LAYER ELECTRODE DEVICE CARRIERS

This application claims priority from PCT International Application Number EP2003/12647, filed 18 Apr. 2003, designating the United States and prior foreign application 02368053.1, filed 23 May 2002 in the European Patent Office.

FIELD OF THE INVENTION

The present invention relates generally to the structure and manufacture of electronic printed circuit boards and chip carriers and more specifically to a particular structure of stacked vias in multiple layers high density electronic device carriers.

BACKGROUND OF THE INVENTION

Several types of electronic components are implemented with a circuit, which is integrated in a chip of semiconductor material. The chip is typically mounted on a carrier, so as to protect the chip from mechanical stresses, and is then encapsulated in a package. The chip carrier includes an insulating substrate with conductive tracks; each track is bonded to a corresponding terminal of the chip, and ends with a contact pad, typically for connection to a printed circuit board. Generally, chip carriers comprise several conductive layers wherein tracks transmitting signals and current are designed according to requirements depending upon both logical and electrical constraints as well as chip carrier manufacture constraints. Connections between layers are often done using vias or plated through holes.

Likewise, printed circuit board generally comprises several conductive layers formed in an insulating material, linked with vias or plated through holes, that are adapted to transmit signals between several electronic devices or between electronic devices and connectors.

When switching speeds of devices goes above 1 GHz clock rate, there is a need to no longer consider electrical signal transmission as a simple point to point transmission on a track but rather as the propagation of an electromagnetic wave supported by a current on a circuit trace. Such traces on electronic device carriers (chip carriers and printed circuit boards), also called transmission lines, represent a system comprising at least two conductive paths with specific properties (relation between transmission line width, distances between transmission lines, dielectric thickness between transmission lines and reference planes). These transmission lines comprise a conductive signal track or trace and another track and/or conductive plane, formed in close proximity and connected to a reference voltage or ground, for shielding the signal track from electromagnetic interference. The wave propagates along a transmission line defined by the signal track and an underlying reference voltage or ground plane, forming a complete loop path for the signal current. When the chip works at a high frequency, e.g. more than 1 GHz, the influence of the electronic device carrier may severely affects the performance of the electronic system as a whole.

Particularly, any discontinuity (or transition) in the transmission line, such as any change in structure, material properties and design features, represent a change in the electrical impedance of the media and this generates a reflected wave. Moreover, the system includes stray structures (capacitors, inductors and resistors), which act as low pass filters for the transmitted signal. As a consequence, the integrity of the electromagnetic wave propagated along the transmission line is not preserved.

The transmitted signal, switching between a low voltage (logic value 0) and a high voltage (logic value 1), generates a square-shaped wave. Due to all discontinuities in the transmission line, this wave undergoes degradation and is generally received as a pseudo-sinusoidal wave. The quality of the transmitted wave can be visualized by a so-called "eye diagram", which plots the value of the received signal as a function of the phase of a clock signal controlling the electronic device. The above described discontinuities in the transmission line reduce the opening of the eye diagram; therefore, it is quite difficult to understand if a switching transition has actually taken place or if the shift of a signal baseline is due to a background noise.

These drawbacks are particular acute in modern electronic systems working with a reduced level of a power supply voltage (down to 1.2 V). In this case, there is a very low margin to discriminate between the logic value 0 (0V) and the logic value 1 (1.2V).

Moreover, the continuous trend towards miniaturization of electronic devices requires a reduction in the dimensions of chip carrier and printed circuit board conductive tracks. However, the impedance of the transmission line must be maintained at a desired value which optimizes the performance of the electronic device (typically 50Ω). Therefore, it is necessary to use a very thin dielectric layer between the conductive tracks and the ground plane (since the impedance is inversely proportional to the track width and directly proportional to the dielectric layer thickness). The short distance between the conductive tracks and the ground plane increases the value of a corresponding stray capacitance; as a consequence, the bandwidth of the transmission line is strongly reduced.

Therefore, as the quality of the transmission in the electronic device carrier, i.e. chip carrier or printed circuit board, is degraded it can cause the electronic device to operate at a frequency far lower than the working frequency which is afforded by the chip.

Such phenomena may be reduced by using stacked vias so as to minimize the number of transition as illustrated on FIG. 1. FIG. 1a shows a cross-section part of a chip carrier 100 of Ball Grid Array (BGA) type comprising a base or a core 105, three conductive layers 110a, 110b and 110c, a surface layer 115 and dielectric layers 120. Generally, dielectric layer are made of epoxy while conductive layer are made of copper however, other materials are also used. Electronic device carrier 100 further comprises two solder balls referred to as 125-1 and 125-2 for connections and a blind plated through hole 130. As illustrated, vias are used to connect conductive layers, e.g. tracks 135 and 140 are connected thanks to vias 145, 150 and 155. However, as shown with black arrows, the transmission line from track 135 to track 140 comprises five transitions that may not preserve integrity of the electromagnetic wave propagated along the transmission line as mentioned above. FIG. 1b shows a similar electronic device carrier 100' wherein vias 145', 150' and 155' are stacked so as to reduce the number of transitions along signal paths. Thus, the transmission line from track 135' to track 140' comprises only one transition as illustrated with black arrow.

Stacking of vias implies manufacturing implications that may be difficult to overcome with standard processes. Creating a buried via means to place a vertical connection between two different conductive layers with a dielectric placed between them. Processes to create this vertical connections are many such as mechanical drilling, laser and others. All of them start from one of conductive tracks present on one of the layers and need a receiving conductive pad in the other layer. Once the opening is achieved the receiving pad is exposed to a plating process that build the electrical conductive path along the aperture vertical walls establishing the continuity for an electrical signal between the two layers. The thickness of this metallization needs to be of a minimum value to compensate thermomechanical stresses and strains generated in the following manufacturing and operating conditions of the substrate. Plating of vias and blind vias conforms to vertical walls that have generally a reversed truncated cone shape. Dimensions of these vias are related to the technology used to create them, they usually have intrinsic plating limitations represented by the aspect ratio between the thickness of the dielectric to be drilled through over the selected diameter with the given drilling technology. The aspect ratio affects plating when the opening dimension, width over depth, reduces the flow of the plating solution within the via. Holes metallization operations in carrier manufacturing need to be accomplished in a reasonable time, with excellent uniformity along the vertical walls. Due to the extensive utilization of thin dielectric layers opening of the holes result larger than the depth of the holes. Plating of stacked vias requires to fill this large gap to achieve an acceptable receiving pad for the forthcoming stacked via extending the plating time. The longer time for plating is adversing the surface Copper circuitization conditions that results in an increased and higher thickness becoming no longer compatible with the fine pitch line to line requirements. Eventually a selective Copper etch-back operation is needed to re-thin the Copper on surface prior to etch the fine pitch circuitry. Manufacturing operations need to account for process tolerances that affect the minimum design dimensions of the stacked vias with further effect of their electrical impedance value.

U.S. Pat. No. 5,758,413 assigned to IBM Corporation disclosed a method of manufacturing a multiple layer circuit board with stacked vias of fine dimension and pitch. A base laminate with conductive pattern is coated with a dielectric which is photolithographically processed to create holes exposing selected regions of the underlying conductive pattern. The holes through the dielectric are plated to form via connections between the surface and the conductive pattern on the base laminate. The recess created by the via is filled with a conductive and plateable polymer which upon curing forms a conductive plug. A second dielectric layer is deposited on the board structure and in succession photolithographically processed to expose the underlying plated via and plug. The hole in the second dielectric-is plated and filled with conductive polymer so as to create a second via vertically aligned with and electrically connected to the underlying first via. The ability to form fine pitch stacked vias is particularly important for printed circuit board structures such as carriers of flip chip die, in that the fine pitch of the solder ball array of the flip chip needs to be expanded and/or disbursed through multiple board layers with minimum area and electrical degradation.

However, such kind of technology presents drawbacks for carrying high-speed signal in electronic device carriers, particularly in electronic device carriers dedicated to end customer telecommunication products. Firstly; it requires additional manufacturing steps that are not required in standard electronic device carrier manufacturing process and thus, increases their prices. Secondly, the transmission path along stacked vias is done through several conductive materials, e.g. copper and conductive polymer, that may disturb high-speed signals, e.g. generating signal reflection. Finally, the use of several conductive materials to stack vias induces mechanical and chemical constraints that may lead to unreliable electrical contacts between stacked vias and/or electronic device carrier fragility.

SUMMARY OF THE INVENTION

Thus, it is a broad object of the invention to remedy the shortcomings of the prior art as described here above.

It is another object of the invention to provide a stacked via structure adapted for carrying high speed signals.

It is still another object of the invention to provide a stacked via structure adapted for carrying high intensity currents.

It is a further object of the invention to provide a stacked via structure that reduces signal or current transmission line lengths.

The accomplishment of these and other related objects is achieved by a stacked via structure in an electronic device carrier to connect a first and a second conductive tracks belonging to a first and a second conductive layers, said first and second conductive layers being separated by at least one third conductive layer, a dielectric layer being disposed between each of said conductive layers, said stacked via structure comprising:
a third conductive track belonging to said at least one third conductive layer, said third conductive track being aligned with at least one part of said first and second conductive tracks according to the axis perpendicular to said conductive layers;
a first set of vias comprising at least two vias disposed between said first conductive track and said third conductive track;
a second set of vias comprising at least two vias disposed between said second conductive track and said third conductive track;
wherein said third conductive track is connected to said first and second conductive track by means of said first and second set of vias, said vias of said first set of vias and said vias of said second set of vias being unaligned.

Further advantages of the present invention will become apparent to the ones skilled in the art upon examination of the drawings and detailed description. It is intended that any additional advantages be incorporated herein.

BRIEF DESCRIPTION OF THE DRAWINGS

FIG. 1 comprising

FIG. 3 comprising FIGS. 3a, 3b, 3c and 3c', represents partial plan views of stacked vias, wherein FIG. 3a represents track design of a first conductive layer, FIG. 3b represents track design of a second conductive layer and FIG. 3c represents track design of a third conductive layer. FIG. 3c' illustrates another example of a track design of the third conductive layer.

DETAILED DESCRIPTION OF THE PREFERRED EMBODIMENT

According to the invention there is provided a stacked via structure that may be implemented in an electronic device carrier comprising several conductive layers. The electrical connection between two tracks belonging to two adjacent conductive layers is done through several vias, at least two and preferably four. The track portion to which vias are connected is designed so that it provides a symmetrical distribution of signal current across these vias. The shape of these tracks can be any geometrical solid metal shape, in a preferred embodiment, the shape of this track portion looks like an annular ring. Vias arranged between a second and a third conductive layers are not disposed at the same locations than vias arranged between a first and the second conductive layers, when considering z axis, to avoid manufacturing and electrical connection drawbacks as discussed above.

Figure 2:
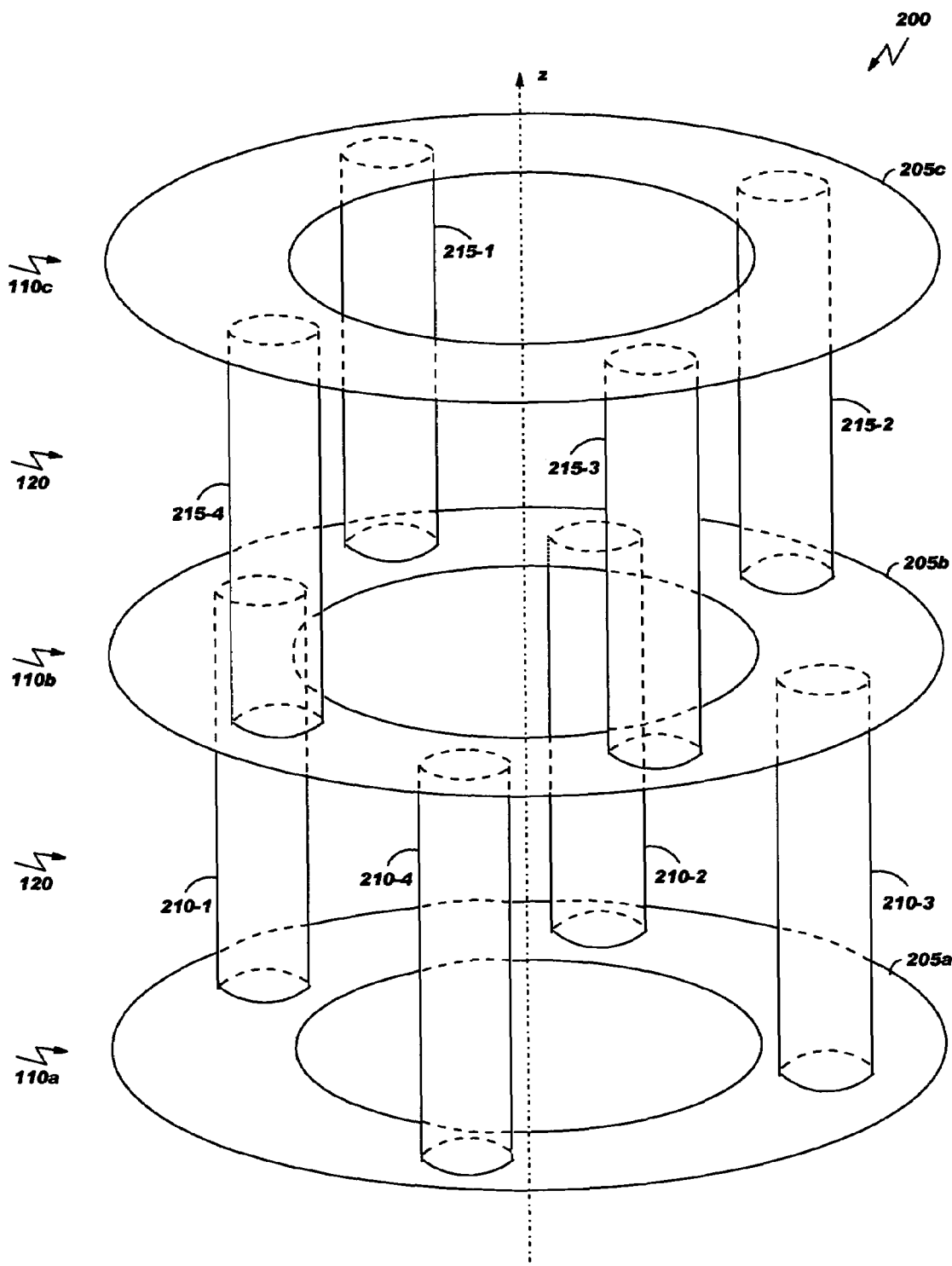
FIG. 2 depicts the 3D structure of stacked vias between three adjacent conductive layers of an electronic device carrier, according to the invention.

With reference in particular to FIG. 2, there is depicted the staked via structure 200 of the invention, adapted to connect two conductive tracks belonging to two different conductive layers that are separated by a third conductive layer. The first conductive layer 110a comprises a first conductive track having the shape of an annular ring, referred to as 205a. Four vias 210-1 to 210-4 (generically referred to as 210) are connected to the annular ring 205a so as to provide an electrical connection with conductive track 205b having also the shape of an annular ring, belonging to conductive layer 110b, adjacent to conductive layer 110a. As mentioned above, conductive layers 110a and 110b are separated by a dielectric layer 120. Vias 210-1 to 210-4 are symmetrically arranged on conductive tracks 205a and 205b so that the electrical signal current flow is uniformly distributed among them. Similar structure is duplicated between conductive layers 110b and 110c. Four vias 215-1 to 215-4 (generically referred to as 215) are connected to the annular ring 205b so as to provide an electrical connection with conductive track 205c having also the shape of an annular ring, belonging to conductive layer 110c. Each vias 215 is connected to conductive track 205b such that the distances between this via and the two closest vias 210 are the same to obtain a uniform distribution of electrical signal current flow from vias 210-i to vias 215-j (i and j varying from 1 to 4). In the illustrated example of FIG. 2, conductive tracks 205a, b and c are of the same size and aligned along z axis, vias 210 are set at positions 0°, 90°, 180° and 270° considering the center of conductive tracks 205a, b and c with z axis and vias 215 are set at positions 45°, 135°, 225° and 315°.

Considering now FIG. 3 illustrating partial plan views of an electronic device carrier, there is shown a track design of three conductive layers 300a, b and c wherein the stacked via structure of the invention is implemented. On FIG. 3a there is depicted a couple of coplanar tracks, referred to as 305-1 and 305-2, which are used to transmit a high frequency differential signal. Track 310 is arranged around signal tracks 305-1 and 305-2 and may be connected to the ground so as to shield the high frequency differential signal. In this example, tracks 305-1, 305-2 and 310 are formed in conductive layer 300a. One end of each tracks 305-1 and 305-2 looks like a partial annular ring, referred to as 315-1 and 315-2, respectively, where four vias 320-1 and four vias 320-2 are connected as illustrated. Now turning to FIG. 3b, there is depicted two conductive tracks 325-1 and 325-2 having the shapes of annular rings. Conductive tracks 325-1 and 325-2 are formed in conductive layer 300b and connected to partial annular rings 315-1 and 315-2 thanks to vias 320-1 and 320-2, respectively. Four vias 330-1 and four vias 330-2 are connected to conductive tracks 325-1 and 325-2, respectively, on the other side of conductive layer 300b when considering vias 320-1 and 320-2. As mentioned above, vias 325-1 and 325-2 are positioned such that the distances between a via of a side and the two closest vias of the other side connected to the same conductive track are the same, e.g. by forming an angle of 45° when four vias are used per side. On FIG. 3c there is depicted a couple of coplanar tracks, referred to as 335-1 and 335-2, which are used to transmit the high frequency differential signal. Track 340 is arranged around signal tracks 335-1 and 335-2 and may be connected to the ground so as to shield the high frequency differential signal as mentioned by reference to FIG. 3a. As illustrated, tracks 335-1, 335-2 and 340 are formed in conductive layer 300c. One end of each tracks 335-1 and 335-2 looks like a partial annular ring, referred to as 345-1 and 345-2, respectively, to which vias 330-1 and 330-2 are connected. FIG. 3c' shows an alternative example of the track design of the conductive layer 300c that now comprises two conductive tracks 345'-1 and 345'-2 having the shapes of disks to which vias 330-1 and 330-2 are connected respectively. In this example, conductive layer 300c is a surface layer and conductive tracks 345'-1 and 345'-2 are adapted to be connected to solder balls (not represented) so as to provide a connection with a chip or a printed circuit board.

Figure 4:
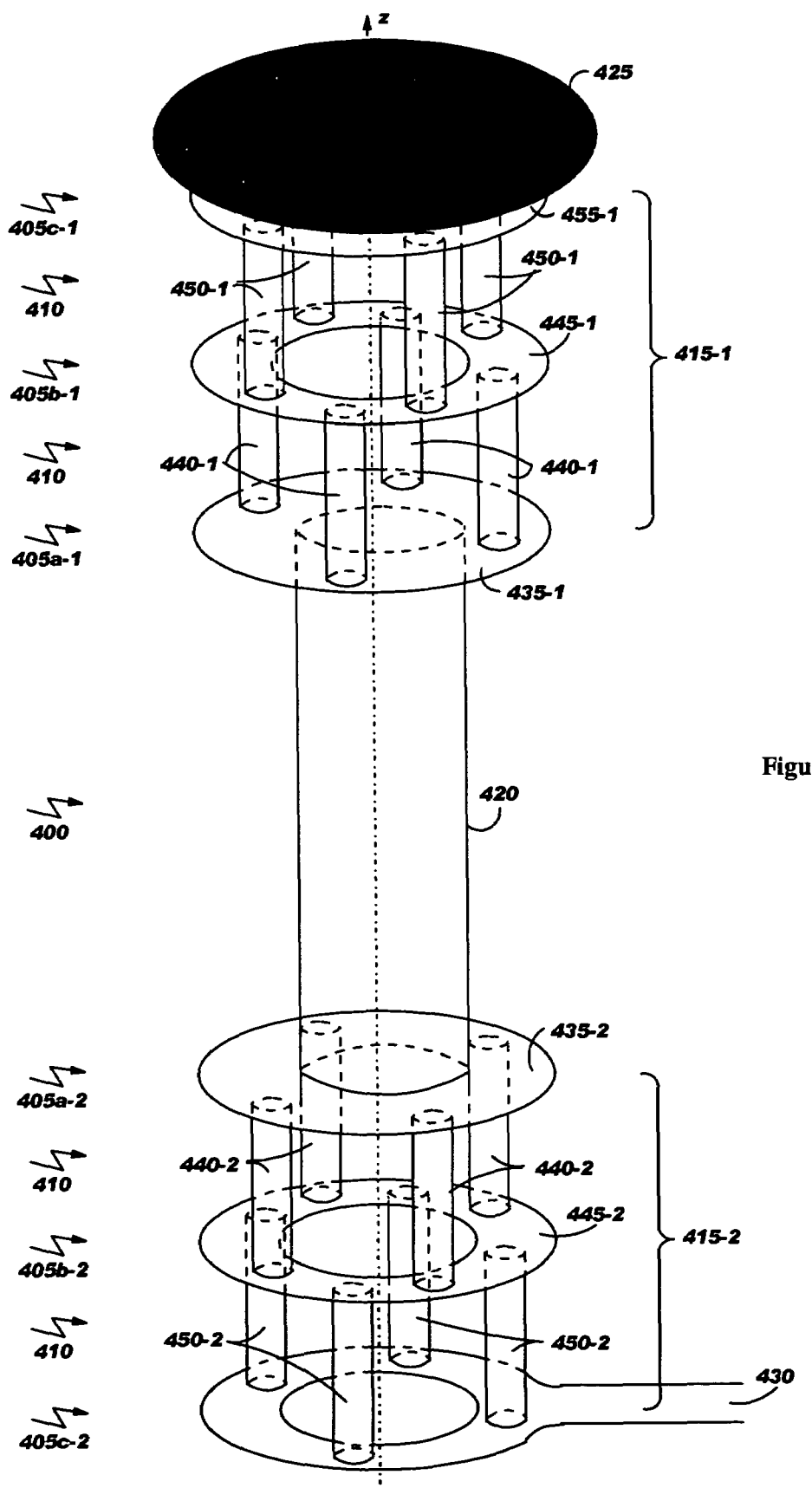
FIG. 4 shows a perspective view of the part of an electronic device carrier comprising a core and three conductive layers on each face to illustrate the use of the stacked via structure of the invention in conjunction with a core plated through hole and a solder ball.

FIG. 4 illustrates a complete conductive path that is adapted to transmit high frequency signal or high intensity current as well as any kind of other signals through an electronic device carrier. For sake of illustration, this electronic device carrier comprises a core 400 with no internal conductive layers, two additional conductive layers added to the core on each side, referred to as 405a-1, 405b-1, 405a-2 and 405b-2 and an external conductive layer 405c-1 and 405-c2 on each side, respectively. Conductive layer are separated by dielectric material 410 such as epoxy. Stacked via structures 415-1 and 415-2 according to the invention are arranged on each side of the core wherein a buried through hole 420 is done to connect these structures. One side of stacked via structure 415-1 is connected to buried through hole 420 and the other side is connected to a solder ball 425 that is adapted to be linked to a chip or a printed circuit board. Likewise, one side of stacked via structure 415-2 is connected to buried through hole 420 and the other side is connected, for the sake of illustration, to a conductive track 430 of the external conductive layer 405 to transmit the signal to another solder ball (not represented) or to another conductive path of the electronic device carrier (not represented). Tracks can be connected on any one of the given layers 405n-1 or 405m-2 (n and m varying from a to c in the illustrated embodiment) that creates the optimized conductive path.

FIG. 4 also illustrates the manufacturing steps of implementing the stacked via structure of the invention. Starting from the electronic device carrier core 400 that is covered with a copper foil, i.e. conductive layers 405a-1 and 405a-2, the core is drilled by mechanical drilling or laser drilling. The obtained hole 420 is then plated using an electroless copper plating operation. The plated hole gets filled with a resin matrix. At this point of the laminate manufacturing process a photomask is used in conjunction with photosensitive material to draw the conductive tracks, i.e. to protect the core with removable material where conductive track has to be implemented. After exposed photoresist is removed with unwanted copper foil, unexposed photoresist is also removed to obtain conductive tracks on the two surfaces of the core also defining the circular metal area or lands 435-1 on the top layer and 435-2 on the bottom layer, surrounding plated hole 420. On this circuitized substrate is then laminated or deposited a new layer of dielectric material 410, this can be in a form of a liquid dispense trough a curtain coating process followed by a curing process or through the lamination of a film. In this new dielectric layer openings can be created through an expose and develop process if the selected material has photosensitive properties or through laser drilling in the case of laminated films. These new holes represent the next layer interconnection step, i.e. connections from conductive layer 405a-1 to 405b-1 and from conductive layer 405a-2 to 405b-2. Using again an electroless copper plating process the whole surface of the newly added dielectric layer gets plated including the newly created holes 440-1 and 440-2 shown for the upper layer in the laminate structure. Again a photomask is used in conjunction with photosensitive material to draw the conductive tracks. After exposed photoresist is removed with unwanted copper foil, unexposed photoresist is also removed to obtain conductive tracks on the two surfaces and defining the circular or annular structure on this dielectric layer, i.e. conductive tracks 445-1 and 445-2. The vias 440-1 at their bottom are in contact with the copper land 435-1 of the top core layer 405a-1 while their top are in contact with the copper land 445-1 of the conductive layer 405b-1 in positions indicated on FIG. 4. Analogous schematization is applicable to the lower side of the core wire vias of the added dielectric layer will be in contact with the underneath land 435-2 and the copper land 445-2 of the conductive layer 405b-2. At this point the whole process is repeated as many times as it is necessary adding new dielectric layers and processing holes and holes plating, i.e. to create vias 450-1 and 450-2 and copper lands 455-1 and 430.

Figure 5:
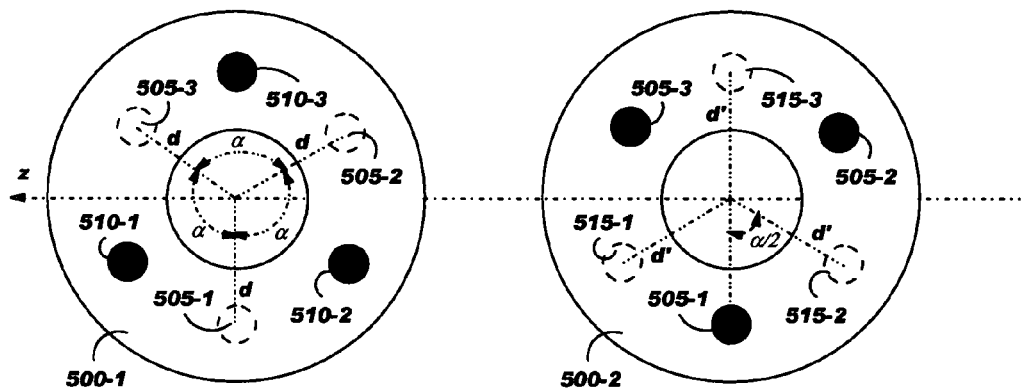
FIG. 5 illustrate how vias have to be preferably disposed when three of them are used to connect conductive tracks of two adjacent conductive layers.

Now turning to FIG. 5, there is shown how vias have to be preferably disposed when three of them are used to connect conductive tracks of two adjacent conductive layers. As mentioned above, the vias must be disposed so as to distribute uniformly the electrical signal current flow among the vias. FIG. 5 comprises two annular rings 500-1 and 500-2 that are formed in two adjacent conductive layers, annular ring 500-1 being formed in the upper conductive layer. Thus, considering annular rings 500-1 and 500-2, the three vias 505-1, 505-2 and 505-3 that link these annular rings must be placed on lines forming an angle of $\alpha=360°/n=120°$ according to z axis, n being the number of vias used to connect two adjacent conductive layer in the stacked via structure of the invention, i.e. n=3 in this example. Furthermore, the distances d between the vias and the center of the annular rings 500-1 and 500-2 must be the same. Likewise, the three vias 510-1, 510-2 and 510-3 that connect annular ring 500-1 to a conductive track of an upper conductive layer and the three vias 515-1, 515-2 and 515-3 that connect annular ring 500-2 to a conductive track of a lower conductive layer have to be disposed according to the position of vias 505-1, 505-2 and 505-3. Vias 510-1, 510-2 and 510-3 must be placed on lines forming an angle of $\alpha=120°$, perpendicular to z axis, these lines forming an angle of $\alpha/2=60°$ with the lines on which vias 505-1, 505-2 and 505-3 are disposed. The distance d' between the vias and the center of the annular rings 500-1 and 500-2 must be the same but does not need to be the same as the distance d between vias 505-1, 505-2 and 505-3 and the center of the annular rings 500-1 and 500-2.

Figure 6:
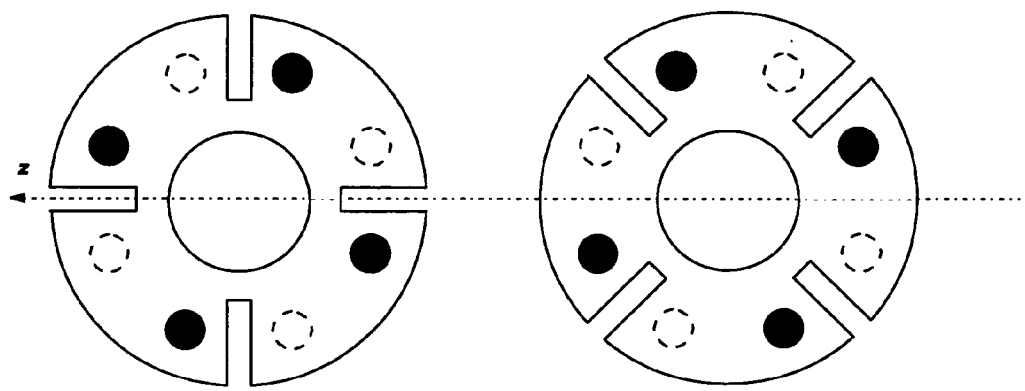
FIGS. 6 and 7 illustrate examples of the shape of the conductive layer track on which vias are connected that may replace the annular ring of the preferred embodiment.
Figure 7:
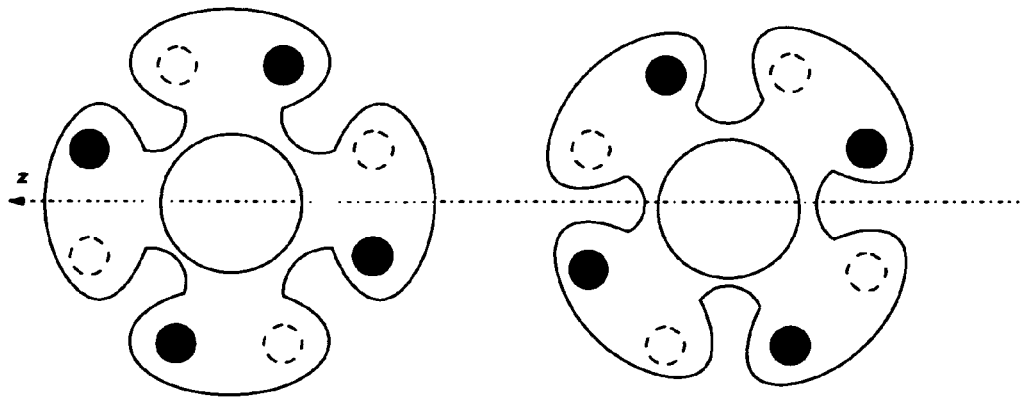

FIGS. 6 and 7 show examples of conductive tracks that may replace the above mentioned annular rings of the stacked via structure of the invention. Each figure comprises the conductive tracks of two adjacent conductive layers and an example of the position of the vias when four of them are used to connect to adjacent conductive tracks. These conductive tracks show a relative rotation of 45° on each of the given layers 500-n (n being the number of the layers available on the different side of the core laminate structures). This configuration with inserted slots in the annular ring or a design with lobes avoid to establish loops for currents that will generate adverse condition to the propagation of the electromagnetic wave.

Figure 1A:
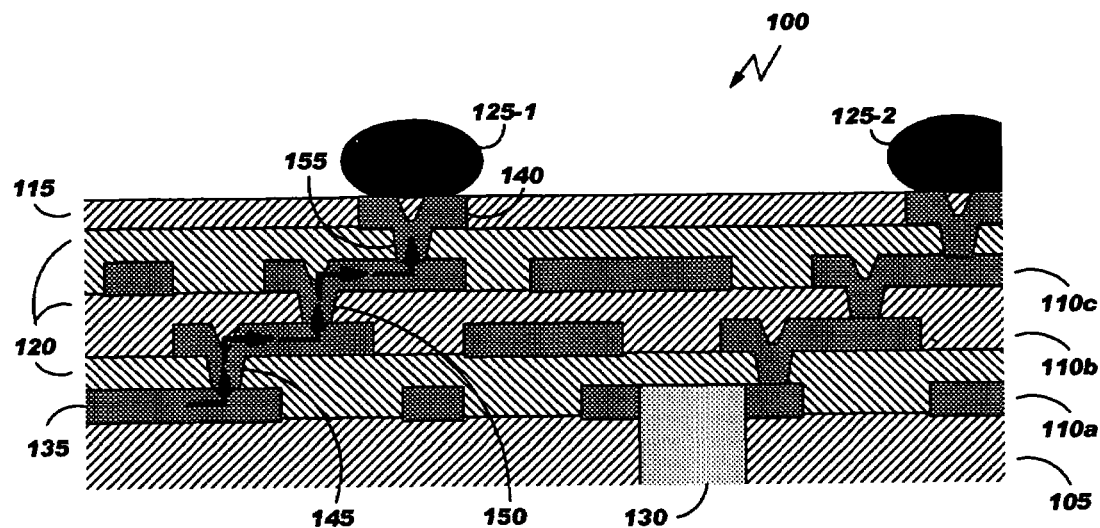
FIGS. 1a and 1b, illustrates cross-section views of an electronic device carrier showing electrical paths between conductive tracks when using non stacked vias (FIG. 1a) and stacked vias (FIG. 1b).
Figure 1B:
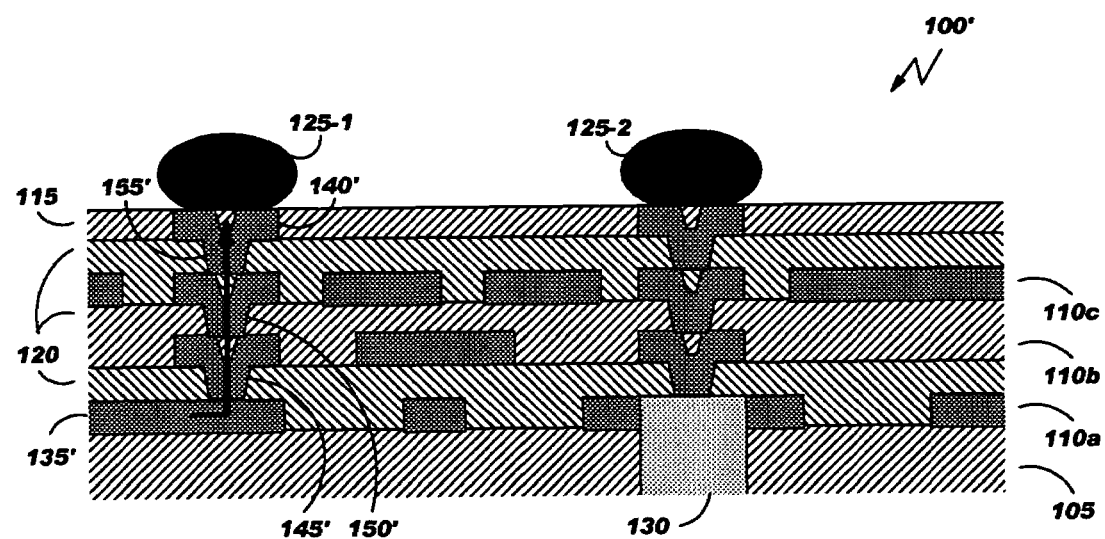
Figure 8:
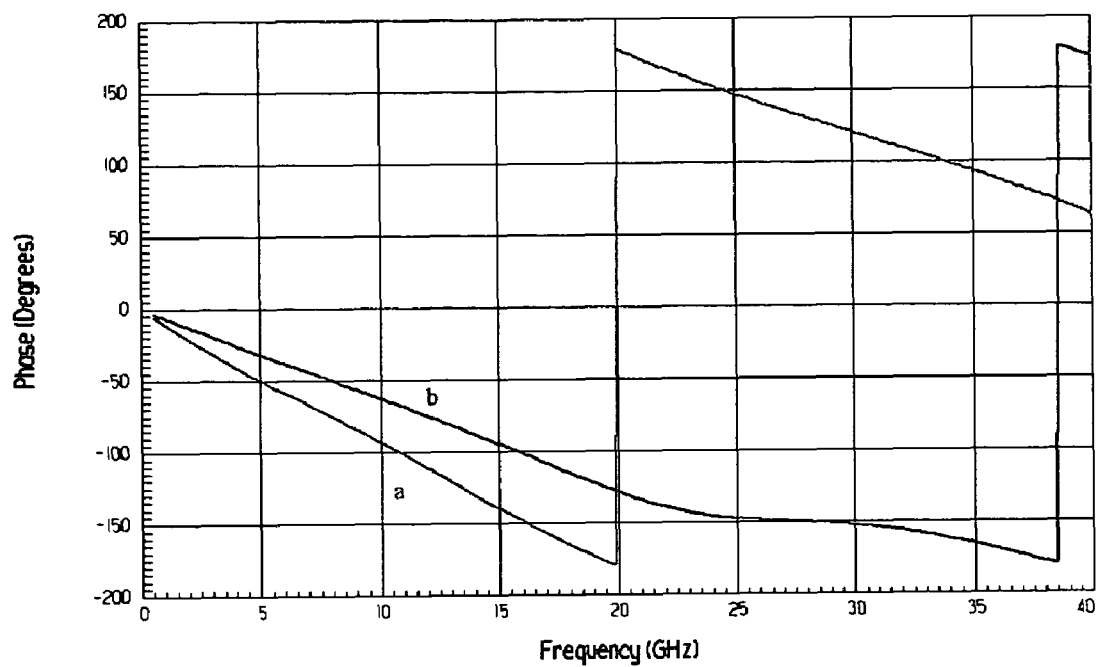
FIGS. 8 and 9 represent diagrams illustrating the advantages provided by the stacked via structure of the invention in terms of electrical behavior by comparing the output of a design example for a known electronic device (curves a) with an electronic device including the stacked via structure of the invention (curves b).
Figure 9:
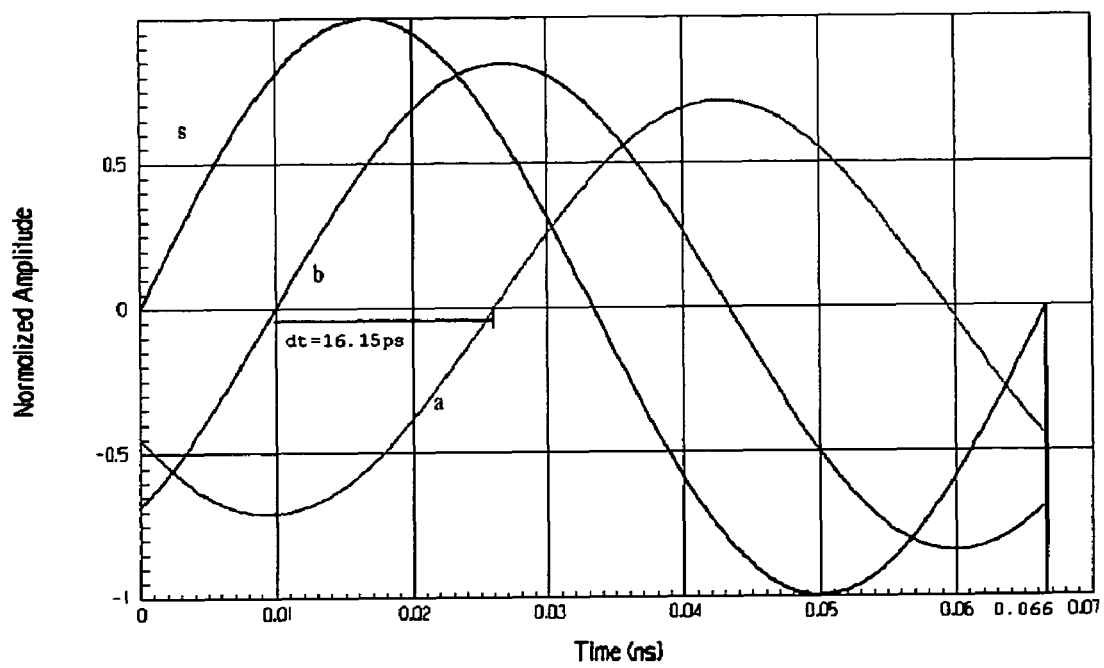

With reference in particular to FIG. 8, there is depicted a diagram representing the phase versus the frequency for a known electronic module wherein vias are not stacked as described by reference to FIG. 1a (curve a) and for an electronic device comprising the stacked via structure of the invention (curve b). This diagram shows that even if mechanically these two structures are comparable allowing the vertical (Z) path transition of the conductive tracks, they show a completely different electrical behaviour. This difference translates in different delays in the transmission of an incident electrical signal. In an application example using signal running at 15 GHz (equal to a cycle time of about 66 ps) the two structures show a difference delay of about 17 ps on the incident wave, as illustrated on FIG. 9 wherein curve s corresponds to the input signal. Such a delay difference represents a quarter of the total cycle time allowing, in the case of stacked structure usage, a better signal management with a lower distortion effect on signal fronts.

Naturally, in order to satisfy local and specific requirements, a person skilled in the art may apply to the solution described above many modifications and alterations all of which, however, are included within the scope of protection of the invention as defined by the following claims.

The invention claimed is:
1. A stacked via structure (200) forming a transmission signal line in an electronic device carrier comprising:
    a first conductive track (205a) belonging to a first conductive layer (110a) connected to a second conductive track (205c) belonging to a second conductive layer (110c), said first and second conductive layers being separated by at least one third conductive layer (110b), a dielectric layer (120) being disposed between each of said conductive layers;
    a third conductive track (205b) belonging to said at least one third conductive layer, said third conductive track being aligned with at least one part of said first and second conductive tracks according to an axis perpendicular to said conductive layers;
    a first set of vias (210) comprising at least two vias disposed between said first conductive track and said third conductive track;

a second set of vias (215) comprising at least two vias disposed between said second conductive track and said third conductive track;

wherein:

said third conductive track is connected to said first and second conductive tracks by means of said first and second set of vias, said vias of said first set of vias being unaligned with respect to said vias of said second set of vias:

said first, second and third conductive tracks and said first and second set of vias form a transmission signal line between said first, second and third conductive layers;

the shape of at least one of said conductive tracks is an annular ring: and said vias of said first or second set of vias are equidistant to the center of said third conductive track and said aligned parts of said first and second conductive tracks.

2. The stacked via structure of claim 1 wherein said first set of vias or said second set of vias comprises four vias.

3. The stacked via structure of claim 1 wherein said first or second conductive track is adapted to be connected to a solder ball.

4. The stacked via structure of claim 1 wherein said first or second conductive track is adapted to be connected to a blind through hole.

5. The stacked via structure of claim 1 wherein said vias of said first and second set of vias are equidistant to the center of said third conductive track and said aligned parts of said first and second conductive tracks.

6. The stacked via structure of claim 5 wherein said vias of said first and second set of vias are spaced radially around said axis perpendicular to said conductive layers and make alternating contact with said third conductive track such that a via of said first set of vias makes contact with said third conductive track, a via of said second set of vias makes contact with said third conductive track and so on until all of said vias make contact with said third conductive track.

7. The stacked via structure of claim 1 wherein the annular ring is an annular ring having lobes.

8. A stacked via structure (200) forming a transmission signal line in an electronic device carrier comprising:

a first conductive track (205a) belonging to a first conductive layer (110a) connected to a second conductive track (205c) belonging to a second conductive layer (110c), said first and second conductive layers being separated by at least one third conductive layer (110b), a dielectric layer (120) being disposed between each of said conductive layers;

a third conductive track (205b) belonging to said at least one third conductive layer, said third conductive track being aligned with at least one part of said first and second conductive tracks according to an axis perpendicular to said conductive layers;

a first set of vias (210) comprising at least two vias disposed between said first conductive track and said third conductive track;

a second set of vias (215) comprising at least two vias disposed between said second conductive track and said third conductive track;

wherein:

said third conductive track is connected to said first and second conductive tracks by means of said first and second set of vias, said vias of said first set of vias being unaligned with respect to said vias of said second set of vias:

said first, second and third conductive tracks and said first and second set of vias form a transmission signal line between said first, second and third conductive layers;

the shape of at least one of said conductive tracks is an annular ring:

said first set of vias or said second set of vias comprises four vias, and the angle formed by two adjacent vias of said first or second set of vias and the center of said third conductive track and said aligned parts of said first and second conductive tracks is equal to 90°.

9. The stacked via structure of claim 8 wherein the angle formed between a via of said first set of vias, the closest via of said second set of vias and the center of said third conductive track and said aligned parts of said first and second conductive tracks is equal to 45°.

10. A stacked via structure (200) forming a transmission signal line in an electronic device carrier comprising:

a first conductive track (205a) belonging to a first conductive layer (110a) connected to a second conductive track (205c) belonging to a second conductive layer (110c), said first and second conductive layers being separated by at least one third conductive layer (110b), a dielectric layer (120) being disposed between each of said conductive layers;

a third conductive track (205b) belonging to said at least one third conductive layer, said third conductive track being aligned with at least one part of said first and second conductive tracks according to an axis perpendicular to said conductive layers;

a first set of vias (210) comprising at least two vias disposed between said first conductive track and said third conductive track;

a second set of vias (215) comprising at least two vias disposed between said second conductive track and said third conductive track;

wherein:

said third conductive track is connected to said first and second conductive tracks by means of said first and second set of vias, said vias of said first set of vias being unaligned with respect to said vias of said second set of vias:

said first, second and third conductive tracks and said first and second set of vias form a transmission signal line between said first, second and third conductive layers;

the shape of at least one of said conductive tracks is an annular ring; and the annular ring is an annular ring having slots.

* * * * *